United States Patent
Oh et al.

(10) Patent No.: US 6,696,338 B2
(45) Date of Patent: Feb. 24, 2004

(54) METHOD FOR FORMING RUTHENIUM STORAGE NODE OF SEMICONDUCTOR DEVICE

(75) Inventors: Kee-Joon Oh, Ichon-shi (KR); Geun-Min Choi, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/291,626

(22) Filed: Nov. 12, 2002

(65) Prior Publication Data

US 2003/0124747 A1 Jul. 3, 2003

(30) Foreign Application Priority Data

Dec. 28, 2001 (KR) ........................................ 2001-86526

(51) Int. Cl.⁷ .......................................... H01L 21/8242
(52) U.S. Cl. ........................ 438/253; 438/250; 438/396
(58) Field of Search ................................ 438/239, 250, 438/253, 254, 255, 396

(56) References Cited

U.S. PATENT DOCUMENTS

| | | | |
|---|---|---|---|
| 6,130,102 A | 10/2000 | White, Jr. et al. | |
| 6,211,034 B1 | 4/2001 | Visokay et al. | |
| 6,274,424 B1 | 8/2001 | White, Jr. et al. | |
| 6,274,471 B1 | * | 8/2001 | Huang .................... 438/597 |
| 6,436,723 B1 | 8/2002 | Tomita et al. | |
| 2003/0017686 A1 | * | 1/2003 | Wada .................... 438/586 |

* cited by examiner

*Primary Examiner*—Jack Chen
(74) *Attorney, Agent, or Firm*—Jacobson Holman PLLC

(57) ABSTRACT

Provided is a method for fabricating a capacitor of a semiconductor; and, more particularly, to a method for forming a Ru storage node of a capacitor that can form a stable storage node. The method includes the steps of: a method for forming a ruthenium (Ru) storage node of a semiconductor device, comprising the steps of: etching an insulation layer on a substrate and forming openings; depositing a Ru layer along the profile of the insulation layer and the openings; filling a photoresist in the openings; performing an etching process until the insulation layer between neighboring openings is exposed and forming isolated Ru storage nodes with the Ru layer in the openings; and removing photoresist and polymers with a solution including $H_2SO_4$ and $H_2O_2$.

6 Claims, 5 Drawing Sheets

H$_2$SO$_4$ / H$_2$O$_2$ CLEANING

METHOD FOR FORMING RUTHENIUM STORAGE NODE OF SEMICONDUCTOR DEVICE

FIELD OF THE INVENTION

The present invention relates to a method for fabricating a capacitor of a semiconductor; and, more particularly, to a method for forming a ruthenium (Ru) storage node of a capacitor.

DESCRIPTION OF RELATED ART

The process of fabricating a capacitor in a semiconductor device with a linewidth no more than 0.1 $\mu$m adopts a metal-insulator-metal (MIM) structure. Here, many researches has been carried out on the method for forming a storage node, and ruthenium (Ru) is usually used as a material for a storage node.

When Ru is used for a storage node, there are such advantages that the capacity is increased and leakage current is reduced. In the formation of a storage node, a chemical vapor deposition (CVD) method is usually used. Therefore, a process window providing stable step coverage in a concave structure needs to be secured.

Referring to FIGS. 1A and 1B, which are cross-sectional views illustrating the conventional process for forming a Ru storage node of a semiconductor, a related-prior art is described herein.

First, as described in FIG. 1A, an oxide insulation layer 11 is formed on the substrate 10 that is already formed with various semiconductor constituents, and a plug 12 is formed thereon to penetrate the insulation layer 11 and contact the substrate 10. The plug 12 contacts the impurity diffusion area (not shown) of the substrate 10, which is source/drain, and includes a TiN barrier layer 12A.

Subsequently, the upper surface of the insulation layer 11 is made planar by performing a chemical mechanical polishing (CMP) process. Then, a second insulation layer 13 is formed to a height of a storage node, and a concave part is formed to expose the surface of the barrier layer 12A by etching the second insulation layer 13 selectively. Subsequently, a Ru layer 14' is formed along the profile of the second insulation layer 13 to form a storage node.

Subsequently, the concave part formed in the second insulation layer 13 is filled with a photoresist PR, as shown in FIG. 1B.

Thereafter, a storage nodes 14 separated from neighboring storages node is formed by etching the Ru layer 14' without a mask. Subsequently, the remaining photoresist is removed by performing dry stripping, as shown in FIG. 1C. That is, an etching process is applied to the Ru layer 14' and the photoresist with $O_2/CF_4/H_2O/N_2$ or $O_2/N_2$, and then residual products and remaining photoresist are removed with solvent.

Subsequently, the substrate is thermally treated to recover the characteristics of the storage node 14 deteriorated during the above etching process, and then a short cleaning process is performed with buffered oxide etchant, prior to the formation of a dielectric layer for the purpose of removing the impurities.

Meanwhile, a series of process for forming a capacitor is completed by forming a dielectric layer and plate electrode on the storage node 14, which are not illustrated in the drawings.

The conventional method for forming a capacitor storage node, as described above, has many disadvantages, which will be described hereinafter with reference to FIG. 2.

In the conventional process described above, if dry stripping is performed with $CF_4$ gas to remove the remaining photoresist after the etching process to form the storage node 14, the $CF_4$ gas penetrates to the storage node made of Ru, and damages the TiN barrier layer under the storage node.

In addition, due to the porous characteristic of a Ru layer, the photoresist still remains on the porous surface of the storage node. The remaining photoresist is not removed even in the subsequent cleaning process using solvent.

In the meantime, good storage node profile can be obtained from optimized gases, but this has a problem in reproducibility.

Besides $CF_4$, $O_2$ gas also has these problems. As shown in FIG. 2, $O_2$ in the stripping gas is detected in the Ru storage node, too. Accordingly, it is hard to obtain stable characteristics of a storage node with the prior art.

SUMMARY OF THE INVENTION

It is, therefore, an object of the present invention to provide a method for forming a stable ruthenium (Ru) storage node of a semiconductor device.

In accordance with an aspect of the present invention, there is provided a method for forming a Ru storage node of a semiconductor device, The method includes the steps of: a method for forming a ruthenium (Ru) storage node of a semiconductor device, comprising the steps of: etching an insulation layer on a substrate and forming openings; depositing a Ru layer along the profile of the insulation layer and the openings; filling a photoresist in the openings; performing an etching process until the insulation layer between neighboring openings is exposed and forming isolated Ru storage nodes with the Ru layer in the openings; and removing residual photoresist and polymers with a solution including $H_2SO_4$ and $H_2O_2$.

The method of the present invention takes an advantage of the superior stability of Ru in acid environment to other metals, and removes residual polymers and photoresist remaining on the Ru storage node by performing cleaning with $H_2O_2$ and $H_2SO_4$. At the same time, this method can protect the TiN barrier layer under the storage node from being damaged, and simplifies the process by incorporating the conventional three-step process into one step.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

Figure 1A:
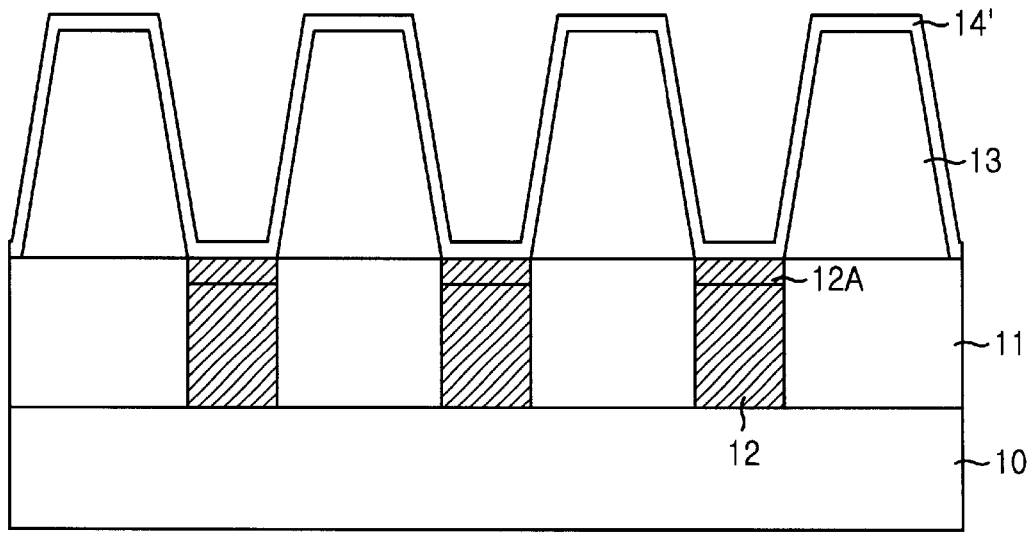
FIGS. 1A to 1C are cross-sectional views describing a process for forming a Ru storage node of a semiconductor device according to a prior art.
Figure 1B:
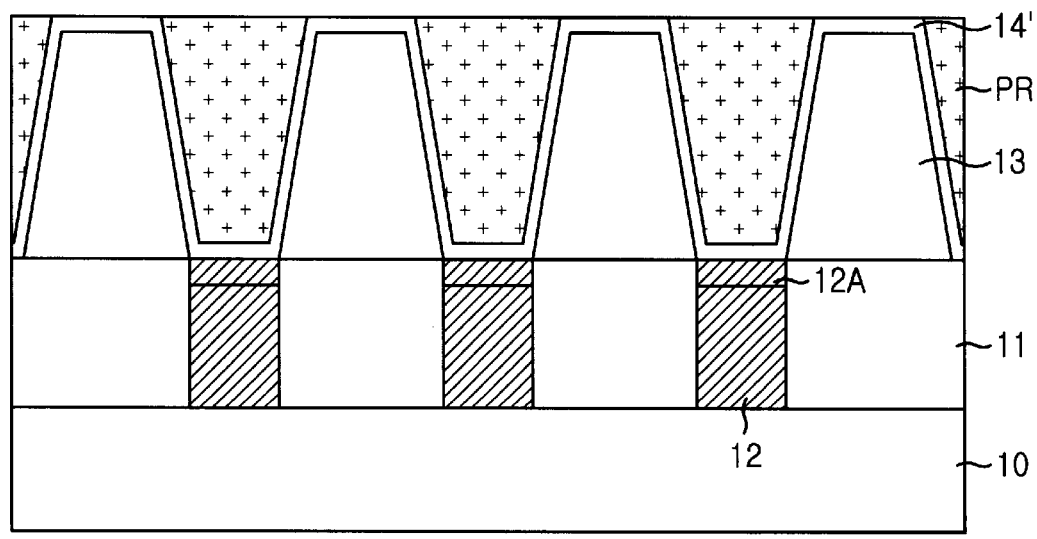
Figure 1C:
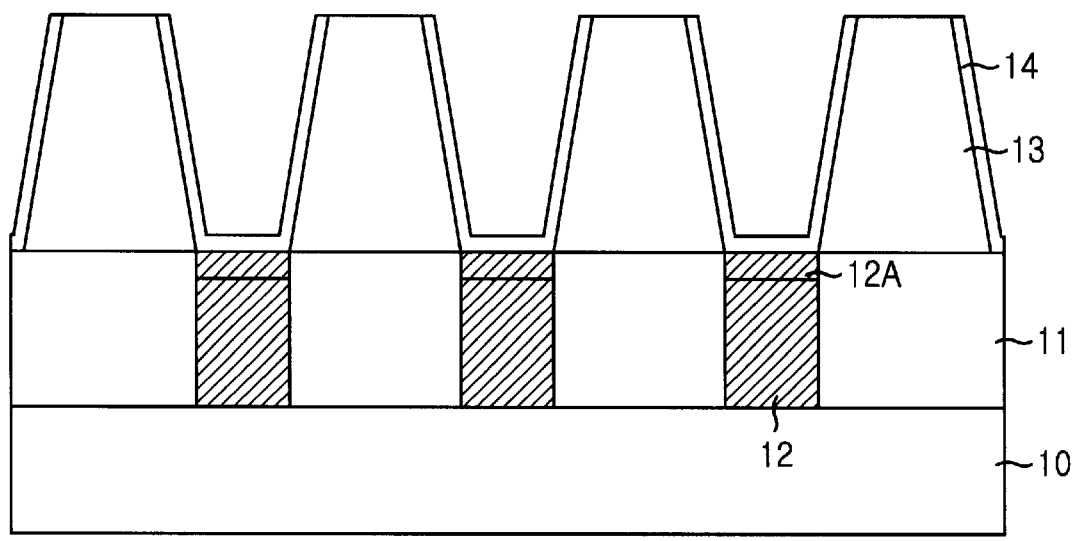
Figure 2:
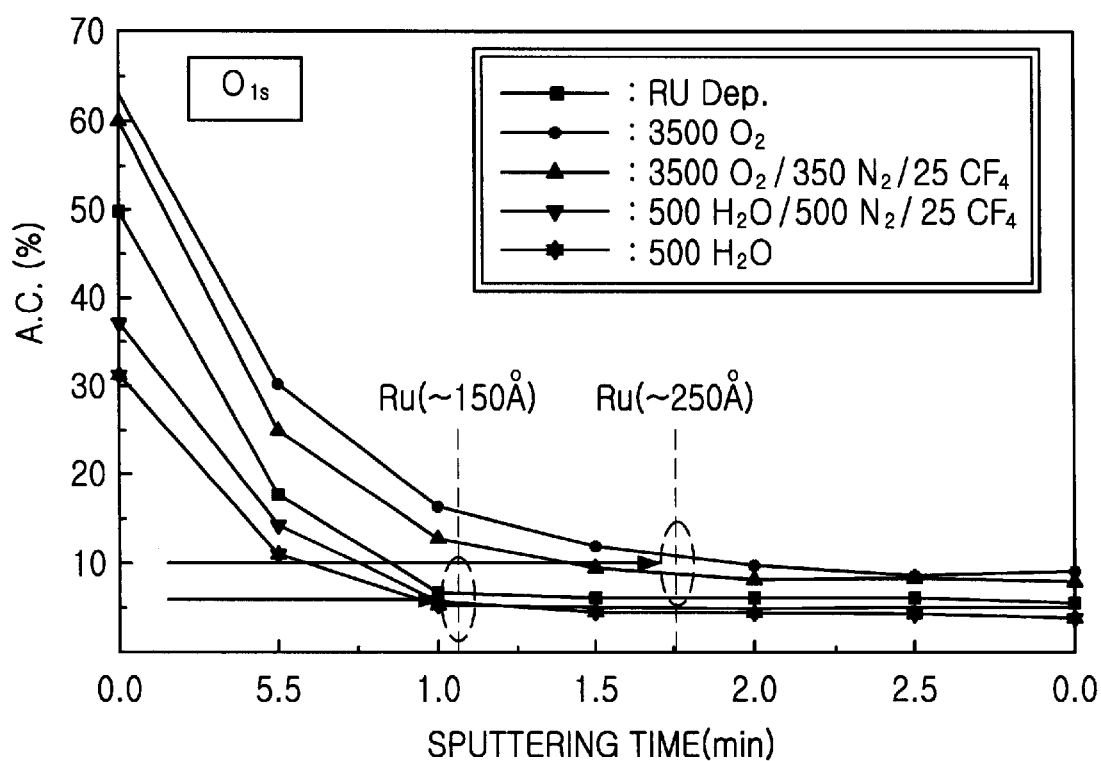
FIG. 2 is a graph presenting the content of $O_2$ depending on sputtering time in the prior art.
Figure 3A:
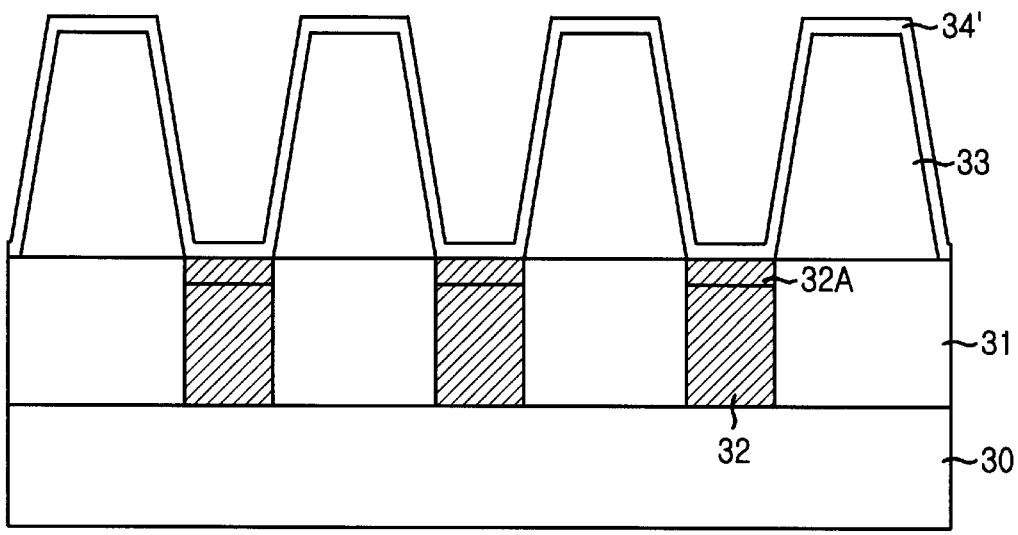
FIGS. 3A to 3D are cross-sectional views showing the process for forming a Ru storage node of a semiconductor device in accordance with an embodiment of the present invention.
Figure 3B:
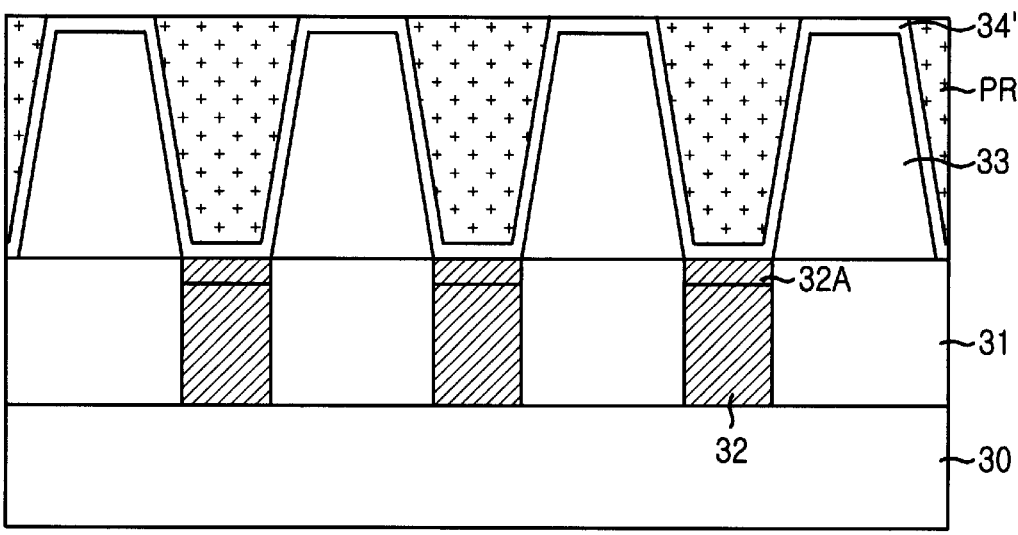

FIGS. 3A and 3B are cross-sectional views showing the process for forming a ruthenium (Ru) storage node of a semiconductor device in accordance with an embodiment of the present invention.

Referring to FIG. 3A, a first insulation layer 31 is formed on a substrate 30, which is already formed with various constituents for a semiconductor device. The first insulation layer 31 is formed of an oxide layer, such as tetraethyl ortho silicate (TEOS). Then, a plug 32 is formed to penetrate the first insulation layer 31. The plug 32 is contacted to the impurity diffusion area(not shonw) of the substrate 30, that is, the source/drain, and includes a barrier layer 32A containing conductive nitride, such as TiN, in the upper part of the plug 32.

After the formation of the barrier layer 32A of the plug 32, the substrate is thermally treated in the ambient of $N_2$. Here, it is desirable to maintain the temperature to about 650° C.

Subsequently, the upper part of the first insulation layer 31 and plug 32 is made planar by performing a chemical mechanical polishing (CMP).

Thereafter, a second insulation layer 33 is formed to a height of a storage node. Then, a concave part is formed to expose the surface of the plug 32 by etching the second insulation layer 33 selectively. Subsequently, a Ru layer 34' is formed along the profile of the second insulation layer 33.

Referring to FIG. 3B, the concave part formed in the second insulation layer 33 is filled with a photoresist PR, and thereby the Ru layer 34' in the concave part is covered with photoresist PR.

Figure 3C:
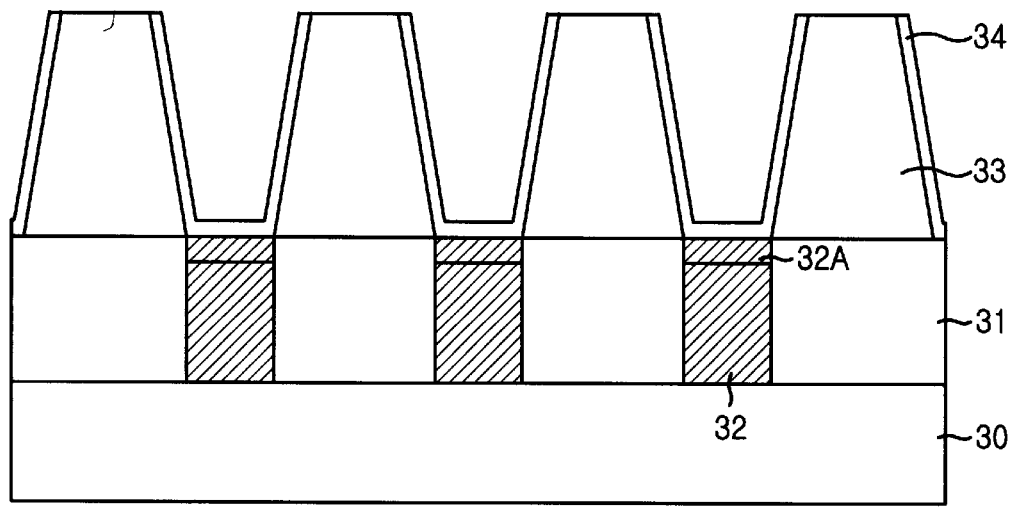

Referring to FIG. 3C, an etching process is applied to the photoresist PR and the Ru layer 34' without a mask, and thereby a Ru storage node 34 separated from a neighboring storage node is formed. The remaining photoresist and polymers are removed simultaneously by performing a wet cleaning using a cleaning solution called Piranha that contains $H_2SO_4$ and $H_2O_2$.

To be more specific, the noble metal Ru is solid but crumbled easily, very stabile in the acid environment, and oxidized into $RuO_2$ when heated up in the atmosphere of oxygen. To take these advantages, acid solution with less metal penetration compared to gases, is used. Specifically, thin Piranha solution is used here to remove the organic photoresist. Thin Piranha solution can remove the photoresist and polymers effectively within a short reaction time, i.e., no more than 10 minutes. Moreover, when the temperature of the process is maintained at around 50 to 90° C., which is far lower than gases, i.e., 250° C., oxidation on the surface of the Ru storage node 34 is prevented. For the short reaction time, the TiN barrier layer under the storage node can be protected from the attack of the acid solution as well, because the solution can penetrate into the Ru crystals only after a predetermined time is passed.

The composition of the cleaning solution described above and the storage node fabrication process can be summarized as follows.

A. The cleaning solution is composed of $H_2SO_4$ and $H_2O_2$ in the ratio of 4:1 to 50:1.

B. The temperature of the process is 50 to 90° C.

C. The processing time is 5 to 10 minutes.

After the wet cleaning, the photoresist dissolved in the cleaning process is rinsed with pure water to be removed.

Then, thermal treatment is performed to recover the characteristics of the storage node 34 that have deteriorated during the etching process. The conventional short cleaning process using BOE that has been carried out prior to the formation of the subsequent dielectric layer can be skipped over, in accordance with the present invention.

Figure 3D:
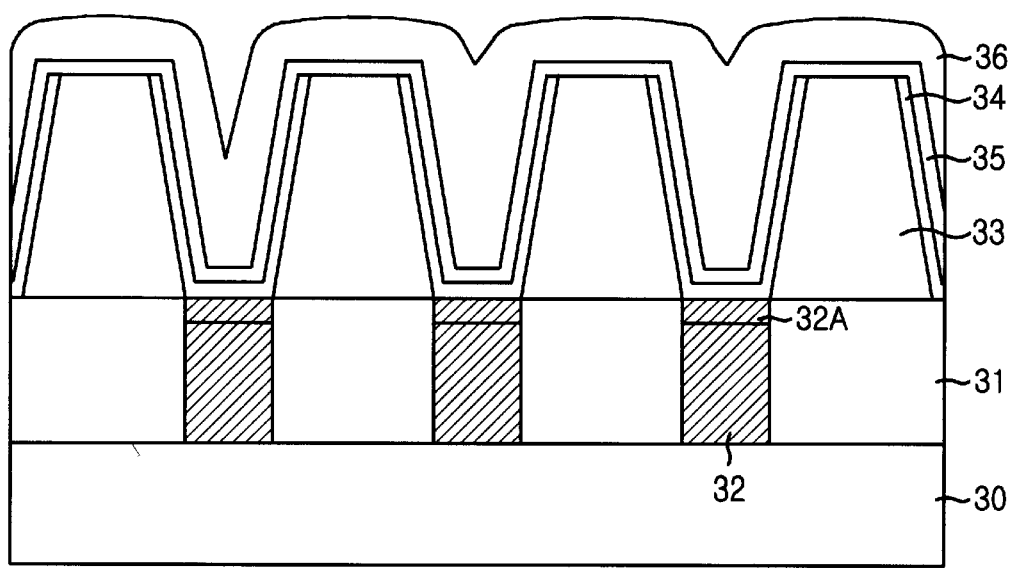

Referring to FIG. 3D, the processes for fabricating a capacitor is completed by forming a dielectric layer 35 and plate electrode 36 on the storage node 34.

As seen from the embodiment of the present invention, this method, which takes an advantage of the high stability of Ru in the acid environment, protects the Ru storage node and the lower part of it from being attacked by cleaning with $H_2SO_4$ and $H_2O_2$ for removing the photoresist and polymers, and simplifies the capacitor fabrication process remarkably by incorporating the conventional etching and two-time cleaning into one-step cleaning process.

As described above, according to this method of the present invention, the loss of a Ru storage node can be minimized and the capacitor fabrication process can be simplified, which eventually, will bring about remarkable effects, such as increase in throughout of semiconductors having Ru storage nodes and more competitive semiconductor price.

While the present invention has been described with respect to certain preferred embodiments, it will be apparent to those skilled in the art that various changes and modifications may be made without departing from the scope of the invention as defined in the following claims.

What is claimed is:

1. A method for forming a ruthenium (Ru) storage node of a semiconductor device, comprising the steps of:

a) forming an insulating layer on a substrate;

b) forming openings in the insulating layer by etching the insulation layer to expose plugs including a barrier layer containing conductive nitride contacted to the substrate;

c) depositing a Ru layer along the profile of the insulation layer and the openings;

d) filling a photoresist in the openings;

e) etching the Ru layer until the insulation layer between neighboring openings is exposed and forming isolated Ru storage nodes with the Ru layer in the openings; and f) removing the photoresist remaining in the openings with a cleaning solution consisting of $H_2SO_4$ and $H_2O_2$ in a ratio of about 50:1.

2. The method as recited in claim 1, wherein the conductive nitride includes TiN.

3. The method as recited in claim 1, wherein the step f) is performed at a temperature of 50 to 90° C.

4. The method as recited in claim 3, wherein the step f) is performed for 5 to 10 minutes.

5. The method as recited in claim 1, further comprising the steps of:

g) rinsing the substrate with pure water after forming the Ru storage nodes; and h) performing thermal treatment.

6. The method as recited in claim 1, wherein the step e) is performed without a mask.

* * * * *